United States Patent [19]

Magnuson

[11] Patent Number: 5,594,338
[45] Date of Patent: Jan. 14, 1997

[54] AUTOMATIC TUNING APPARATUS AND METHOD FOR SUBSTANCE DETECTION USING NUCLEAR QUADRUPOLE RESONANCE AND NUCLEAR MAGNETIC RESONANCE

[75] Inventor: Erik E. Magnuson, Escondido, Calif.

[73] Assignee: Quantum Magnetics, Inc., San Diego, Calif.

[21] Appl. No.: 400,673

[22] Filed: Mar. 8, 1995

[51] Int. Cl.⁶ ............................................. G01R 33/28
[52] U.S. Cl. ............................................. 324/318; 324/322
[58] Field of Search ............................... 324/318, 322, 324/314, 300, 311; 128/653.5

[56] References Cited

U.S. PATENT DOCUMENTS

| | | | |
|---|---|---|---|
| 4,769,602 | 9/1988 | Vinegar et al. | 324/303 |
| 4,827,219 | 5/1989 | Harrison | 324/322 |
| 4,890,063 | 12/1989 | Haragashira | 324/322 |
| 5,041,788 | 8/1991 | Kontor et al. | 324/318 |
| 5,298,863 | 3/1994 | Nowak et al. | 324/322 |
| 5,347,222 | 9/1994 | Fox et al. | 324/322 |
| 5,451,873 | 9/1995 | Freedman et al. | 324/303 |

OTHER PUBLICATIONS

*Descriptive Specifications for Collins 180L–2 Automatic Antenna Tuning Unit*, 16 pages, cover to cover (1995).

*Primary Examiner*—Sandra L. O'Shea
*Assistant Examiner*—Raymond Y. Mah
*Attorney, Agent, or Firm*—Baker, Maxham, Jester & Meador

[57] ABSTRACT

Apparatus for tuning a system for detecting a target substance through the use of nuclear quadrupole resonance (NQR) or nuclear magnetic resonance (NMR). The apparatus tunes an RF coil which is employed to excite the substance under test. The tuning apparatus includes a series of fixed value capacitors switched in the tuning circuit by controllable switches. A programmable controller is employed to control the switching and thereby the tuning of the coil.

7 Claims, 3 Drawing Sheets

AUTOMATIC TUNING APPARATUS AND METHOD FOR SUBSTANCE DETECTION USING NUCLEAR QUADRUPOLE RESONANCE AND NUCLEAR MAGNETIC RESONANCE

BACKGROUND

1. Field of the Invention

This invention relates generally to a bulk substance detection systems for detecting concealed explosives and narcotics employing either nuclear quadrupole resonance or nuclear magnetic resonance, and more particularly to a practical system and method for tuning such detection systems.

2. Discussion of the Related Art

Certain atomic nuclei, typically having a spin quantum number of ½, exhibit magnetic signatures when they are within an externally applied magnetic field. This magnetic resonance effect is most commonly observed in $^1H$, and is known as nuclear magnetic resonance (NMR). Atomic nuclei with a spin quantum number of >½ can also show another magnetic signature associated with the interaction of the nuclei with the local electric field. This phenomenon is known as nuclear quadrupole resonance (NQR).

For both of these phenomena, the energy level transitions are observed primarily in the radio frequency range. Detection of these transitions thus requires a radio frequency source to excite the transition, and a radio frequency receiving mechanism to detect the signal. Normally, the signals appear at a pre-defined frequency. An RF coil tuned to, or close to, that predefined frequency can excite or detect those signals. The signals are of very low intensity and can only be observed for a short time, approximately 10 μs to 2 ms. As a consequence, there is a need for an NQR or NMR receiver that can be tuned to (usually) high Q, has very low noise, and is capable of fast recovery after a high voltage RF pulse. In most conventional magnetic resonance (NMR and NQR) experiments, small and fairly homogeneous samples are investigated.

Over the past few years there has been considerable interest in the larger-scale "real world" applications of both NQR and NMR. These applications do not benefit from the luxury of small-scale laboratory investigations. They usually require investigation of large volumes filled with materials of vastly differing physical and chemical composition. Investigation of the contents of mail or baggage for the presence of explosives or narcotics is an example.

With respect to explosives, plastic explosives such as C-4 and Semtex, containing RDX and PETN, have an almost infinite variety of possible shapes and uses for terrorist bombing tactics. Plastic explosives are highly stable, have clay-like malleability and are deadly in relatively small quantities. A small piece of plastic explosive, a detonator, and a trip wire inside a large mailing envelope can cause a deadly explosion. Unfortunately, without close—and potentially dangerous—visual inspection, plastic explosives can be made virtually untraceable. In particular, detection of sheet explosives, typically having a thickness as small as one-quarter inch, has not been effectively accomplished by prior technologies.

The wide-scale attempts to fight the illegal drug trade indicates that narcotics detection is also extremely important. The need for a simple procedure for detecting drugs inside sealed containers, mail parcels, and other small packages, quickly and accurately, is immeasurable. Conventional detection methods are time-consuming, costly, and have only marginal reliability at best.

Detection by means of NQR or NMR is possible for both explosives and narcotics, partially because they have as a constituent element $^{14}N$ in crystalline form. Particularly with respect to narcotics, this is true of cocaine base, cocaine hydrochloride and heroine based narcotics. The hydrochloride forms of narcotics, such as cocaine hydrochloride, also contain quadrupolar nuclei $^{35}Cl$ and $^{37}Cl$.

A significant factor in contraband detection by means of NQR in particular is that quadrupolar nuclei that are commonly present, and potentially readily observable, in narcotics and explosives include nitrogen ($^{14}N$) and chlorine ($^{35}Cl$ and $^{37}Cl$), among possible other nuclei. Thus, in commercial applications it is necessary to be able to detect quadrupolar nuclei contained within articles of mail, mail bags or airline baggage, including carry-on and checked luggage. While the resonant frequencies of the nitrogen in these substances differs for each chemical structure, these resonant frequencies are well defined and consistent. By applying an RF signal to a container having any of these suspected substances inside, and then detecting any quadrupolar resonance thus engendered by the application of RF pulses, the identity of the contraband substance can be easily determined.

NQR and NMR signals originate from the energy transitions associated with certain nuclei. These energy transitions are usually in the radio frequency range. Thus, detection of both NQR and NMR signals normally requires the use of radio frequency transmitting and receiving apparatus. To minimize noise and radio frequency power requirements and improve receiver sensitivity, conventional NQR and NMR systems use a narrow band, high Q, sample coil for both transmitting and receiving. There are, however, a number of factors that can significantly degrade the effectiveness of detecting NQR and NMR signals using this kind of narrow band, high Q, detection apparatus. Some of them are:

(1) the presence of large conductive materials inside the sample coil;
(2) the presence of materials with high dielectric constant inside the sample coil;
(3) temperature, which can affect the value of the capacitance used for tuning and matching the RF coil; and
(4) mechanical movement of the coil with respect to its surroundings.

All of these factors can cause serious de-tuning of the detection apparatus, which in turn causes a reduction in the detection sensitivity of NQR and NMR signals from the materials inside the sample coil.

Previously, for most applications of NQR and NMR, these conditions have not presented a serious drawback. The apparatus could usually be set up under near-optimum conditions, and the materials being investigated were usually well characterized. However, over the past few years several new applications have arisen which require NQR and NMR apparatus and methods for the detection of certain materials under adverse conditions (for instance, applications in which large volumes of largely uncharacterized materials are under investigation).

SUMMARY OF THE INVENTION

Broadly speaking, this invention provides a practical method and apparatus for improved methods for bulk detection of substances using nuclear magnetic resonance (NMR) and nuclear quadrupole resonance (NQR) under less than optimum conditions. The invention is a method of, and apparatus for, automatic fine tuning of an NQR or NMR detection coil/head under such adverse conditions. The system consists of a series of fixed value capacitors switched by vacuum relays. The amount of capacitance switched into the tuning circuit is determined by measuring the amount of power being transferred from the RF amplifier to the RF detector coil (or more precisely the amount of "forward" to "reflected" power). The means to measure this power transfer efficiency consist of a variety of common RF techniques. For one application, a directional watt meter is used to measure the amount of "forward" to "reflected" power. Based on the power transfer efficiency, capacitors are switched in or out of the circuit to maximize power transfer efficiency from the RF amplifier to the RF coil. The system is thus re-tuned to provide the most efficient and most sensitive RF coil.

BRIEF DESCRIPTION OF THE DRAWING

The objects, advantages and features of this invention will become readily apparent from the detailed description, when read in conjunction with the accompanying drawing, in which.

DETAILED DESCRIPTION OF THE PREFERRED EMBODIMENTS

Figure 1:
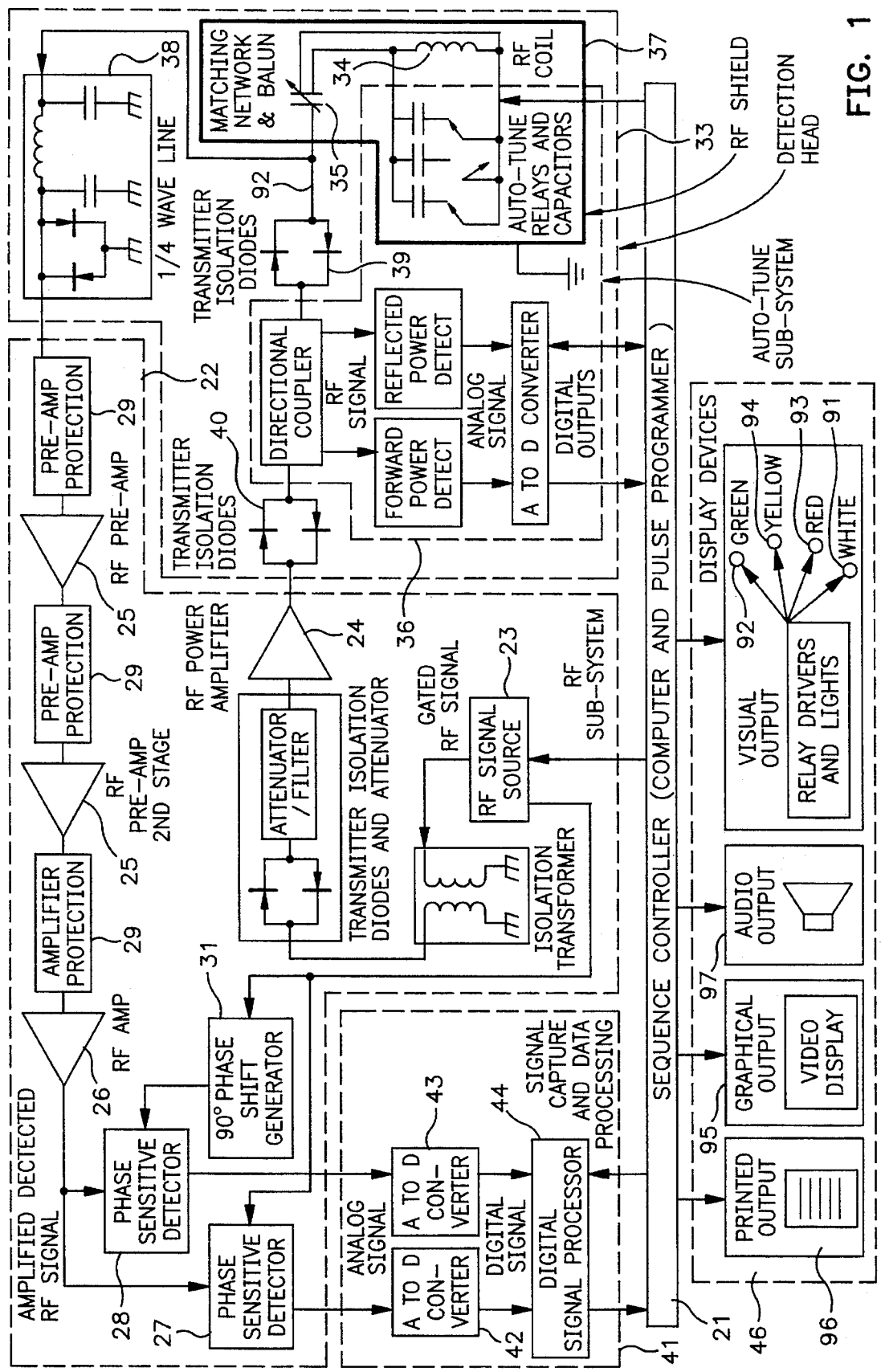
FIG. 1 is a block diagram of an NQR detection system which includes the automatic tuning apparatus of the invention.

The method and apparatus determine the state of the tune of the RF coil in the detector head by measuring the amount of power being directly transferred to the RF coil (the "forward" power), and the amount of power being lost due to losses in the circuit and mistuning (the "reflected" power). Once the state of tune of the RF coil has been determined by the values of the forward and reflected power, the coil is re-tuned by switching in capacitance according to the algorithm described below.

Before describing the tuning apparatus of the invention in detail, FIG. 1 will be described. This is an NQR detection system which includes the tuning apparatus of the invention as an integral and significant part. Here is shown the detection system where block 21 is a sequence controller subsystem. This subsystem provides precise timing and other control functions for all other elements and subsystems of the invention. It generally would comprise a microprocessor-based device which provides means to download and initialize the sequence control information to all other subsystems, and would include appropriate data storage or memory means. It also stores information on the results of individual scans for future reference. As one specific embodiment, the microprocessor based control and storage device may be a personal computer (PC) with a hard disk.

The sequence controller subsystem also includes a pulse programmer which is a high-precision, high-resolution device that runs off the standard computer bus. The pulse programmer provides the precise sequence control required for correct operation of all other major components in the NQR scanner shown. In combination with the personal computer, it also provides the precisely defined pulses and triggers to activate the subsystems to which it is connected and which will be discussed in detail below.

Radio frequency (RF) subsystem 22 has several functional elements including RF signal source 23, RF power amplifier 24, receiver RF preamplifiers 25, receiver RF amplifier 26 and detectors 27 and 28. The detectors are here shown as phase-sensitive detectors. A 90° degree phase shift generator 31 is also part of the RF subsystem. This is one embodiment of the invention and is used when detectors 27 and 28 are phase shift detectors. Conventional amplifier protection devices 29 are also part of the RF subsystem.

RF signal source 23 provides either continuous or pulsed RF excitation at a frequency corresponding to the resonant frequency of the sample material. For example, RDX-based plastic explosives have a resonant frequency of approximately 3.410 MHz while PETN-based plastic explosives have a resonant frequency of approximately 890 KHz. The excitation source is fed into amplifier 24 of sufficient power rating to generate about 1 gauss of RF magnetic field within the coil. The excitation frequency need not be exactly the same as the target substance NQR frequency but it should be within about 500–1000 Hz. The RF excitation for NQR detection could be a single pulse of 10 μs–500 μs duration, depending on the substance being tested for. Such a single pulse could cause an NQR return, but the nuclei may not have reached a steady state of precess so the NQR return might not be sufficiently strong to be detectable or useful. For a letter bomb scanner, approximately three seconds of RF pulses at a repetition rate of 667 pulses per second, meaning a train of 2000 pulses having a pulse width of 200 μs each, would preferably be applied. The frequency of these pulses can range between 300 Hz and 2 KHz. This would result in a series of NQR signals which are added and averaged in digital signal processor 44. This is an application of the conventional technique where target signals are added linearly while noise adds randomly, thereby building a clearly definable pulse by improving the signal-to-noise ratio (SNR). Any method to improve SNR might advantageously be used.

The power requirements of the NQR scanner are generally proportional to the detection coil volume. An explosives scanner for mail packages with a 25 liter detector coil volume might have an RF power amplifier rated at about 25 Watts, peak value, for example. The amplifier produces a uniform RF field of about 1 gauss over the entire 25-liter volume. In other applications, such as in narcotics detection, the RF field may be greater than this value. For airline baggage, an explosives detection head of about 300 liters (10 ft$^3$) requires a 1 to 2 KW RF power amplifier. These parameters are provided for reference purposes and are not meant to define or limit the actual characteristics of a practical NQR system.

The RF excitation pulses are fed from amplifier 24 into detection head 33, the operation of which will be discussed below. After the sample in the detection head has been excited by the RF pulse, a short RF coil "ring-down" or dead time occurs, during which the receiver is "deaf," before sensing occurs. This ring-down time could, for example, be 500 μs. Then RF coil 34 detects the NQR signals and the response is amplified by low-noise, high-gain preamplifier 25 having a gain of 20 to 30 dB, and a noise figure of 1 to 2 dB. Examples of such preamplifiers are Anzac Model AM-110 and Mini-Circuits Model ZFL-500 LNS.

In the package or letter scanner size configuration of the invention, after the received signal has been sufficiently amplified by RF amplifiers 25 which, together with amplifier protection components 29, include appropriate conventional filter functions, it is fed into two phase sensitive detectors 27 and 28, having reference signals shifted 90° from each other by means of phase shift element 31. Note that reference RF signal from RF source 23 is applied to phase sensitive detector 27 while the reference signal to phase sensitive detector 28 passes through phase shift element 31. The two mutually phase-shifted analog signals are then fed into signal-capture and data processing subsystem 41, which will be discussed below.

Detection head subsystem 33 is comprised of four main components. These are RF coil 34, an RF probe circuit which is RF tuning and matching network 35, RF shield 37, and auto-tune subsystem 36 of this invention. The detection head serves two primary purposes. One is to produce a homogeneous RF field in the RF coil. The other is to receive the raw NQR signal, if present, from the item under investigation.

RF coil 34, which may also referred to as an antenna, is made of a highly conductive material, such as copper. The conductor should have a thickness in the order of at least five times the skin depth of the material of the conductor at the operational frequency. This ensures a minimal amount of resistance to the flow of current when the coil is energized with RF. A 25 liter detection volume (for a mail scanning device) has a single turn, high-Q, 0.010 inch-thick copper coil made of a single sheet. The skin depth of copper at 3.4 MHz is about 0.001 inches and the skin depth of copper at 900 KHz is about 0.002 inches.

Direct coil tuning results in an increased overall efficiency for the mail scanning embodiment of the invention. This tuning is accomplished by subsystem 36 of this invention. The single-turn, high-Q coil, when no sample is present, that is, the coil is empty, requires approximately 30,000 pF of capacitance for tuning at about 3.4 MHz in order to detect the $^{14}$N resonant frequency of RDX explosives. Using a series of switches to add or remove capacitance in order to re-tune the coil under differing load conditions, it has been determined that it would be useful for the system to be re-tunable for a 10% change in tuning capacitance. In this particular application, the coarse tuning increments in capacitance were selected to be approximately 80 pF, and in the fine tuning mode, 10 pF. The RF signal source and amplifier (23, 24) of RF subsystem 22 used to exercise the auto-tune subsystem are the same as those used to excite the RF coil for substance detection purposes. Details of the auto-tune subsystem follow.

Figure 2:
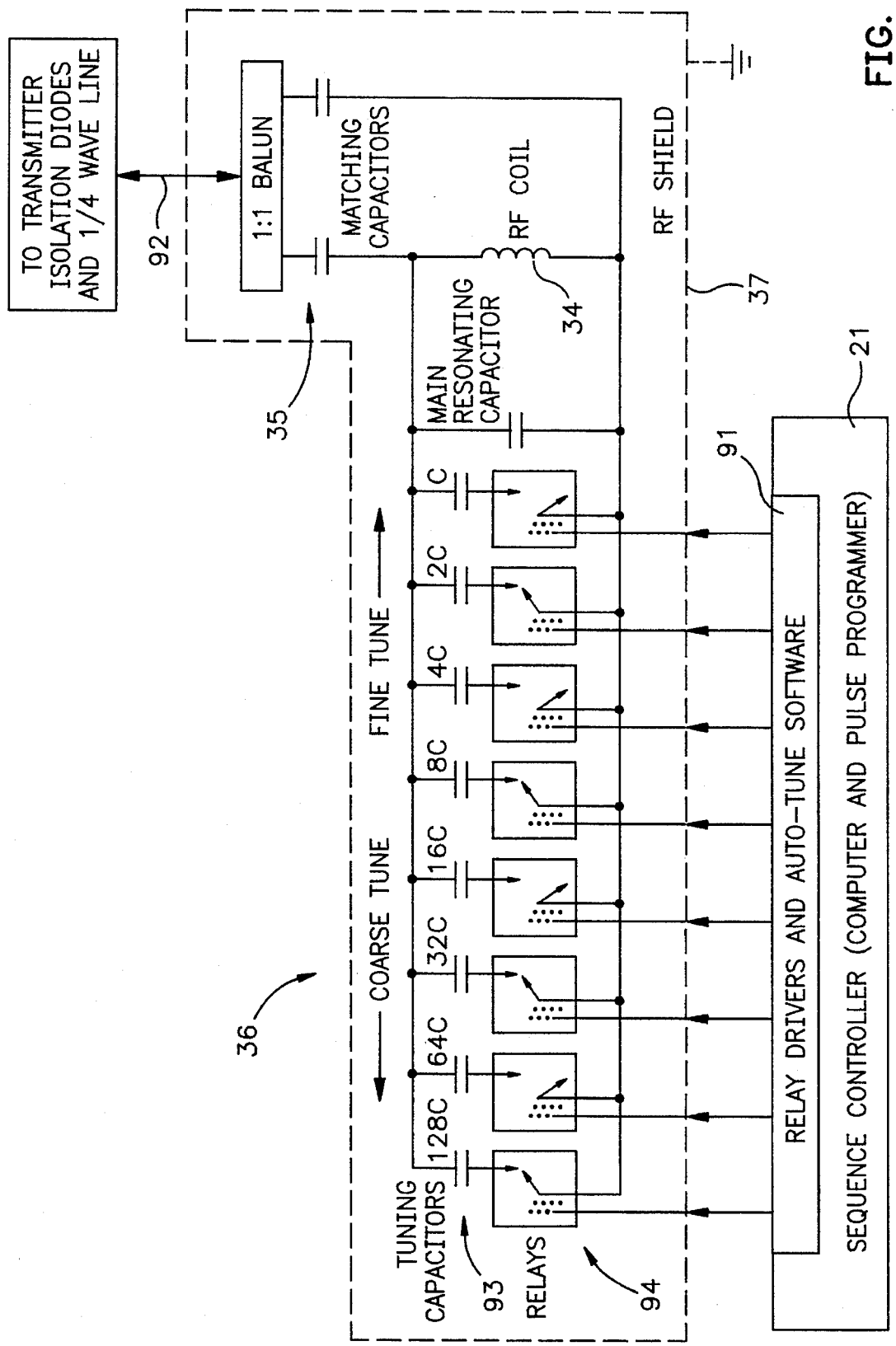
FIG. 2 shows the auto-tune subsystem in greater schematic detail.

The apparatus of the invention for automatic fine tuning of the NQR detection coil/head under adverse conditions is shown in detail in FIG. 2. Within sequence controller 21 is software or control programming 91 for auto-tune subsystem 36. The auto-tune subsystem is preferably incorporated within RF shield 37, as are RF coil 34 and matching network 35. Input/output line 92 connects the tuned RF coil to the amplified RF excitation signal and connects the coil as the receiver of the NQR signals to ¼ wave line 38 (FIG. 1).

The system consists of a series of fixed value capacitors 93 switched by an equal number of vacuum relays 94. The amount of capacitance switched into the tuning circuit is determined by measuring the amount of power being transferred from RF amplifier 24 to RF detector coil 34 (or, more precisely, the amount of "forward" to "reflected" power.) The means to measure this power transfer efficiency consist of a variety of common RF techniques. For one application, a directional watt meter is used to measure the amount of "forward" to "reflected" power. Based on the power transfer efficiency, capacitors are switched in or out of the circuit to maximize power transfer efficiency from the RF amplifier to the RF coil. The system is thus re-tuned to provide the most efficient and most sensitive RF coil. Once the state of tune of the RF coil has been determined by the values of the forward and reflected power, the coil is re-tuned by switching in capacitance according to the algorithm described below.

Figure 3:
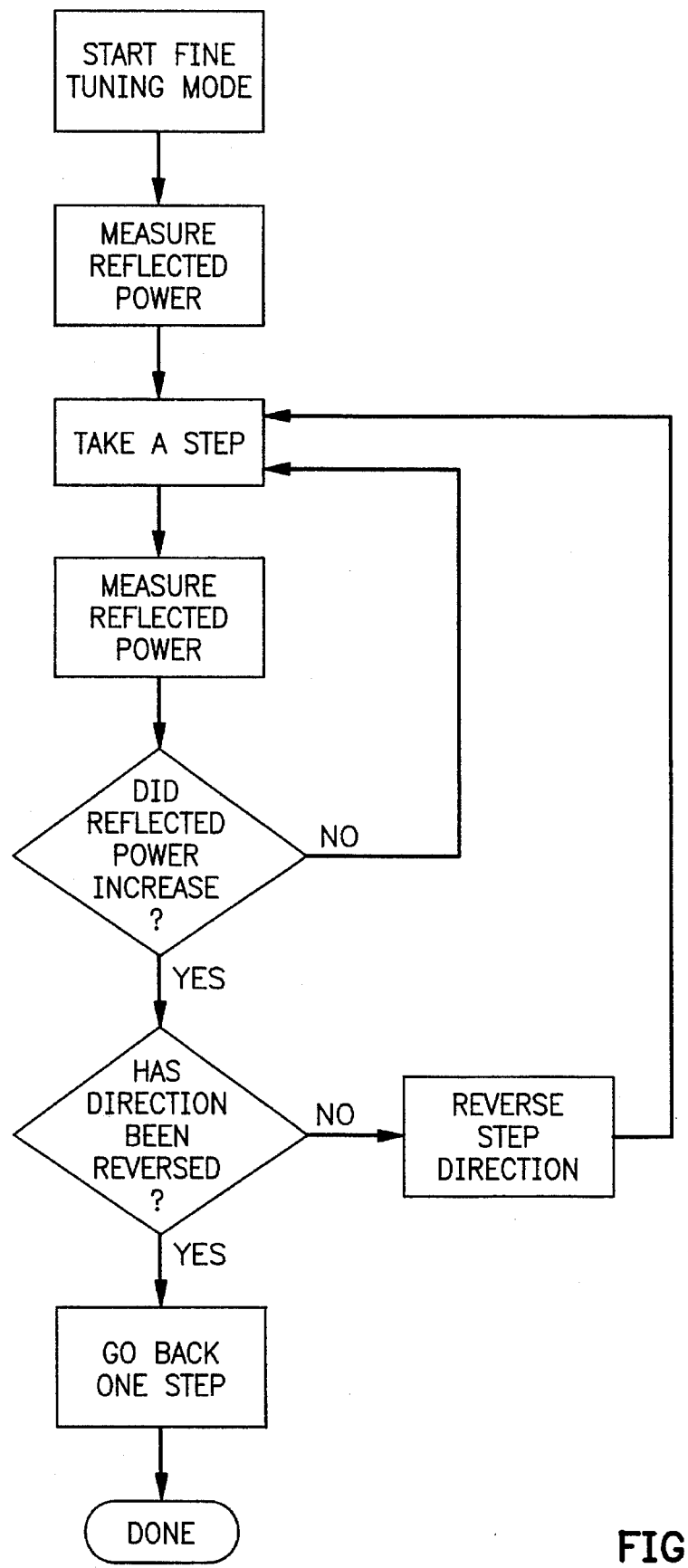
FIG. 3 is a flow diagram of the operation of the auto-tune subsystem of FIG. 2.

Tuning of the RF coil consists of two stages: coarse tuning and fine tuning. A flow diagram for the sequence is shown in FIG. 3. The value of "C" in FIG. 2 has been chosen to be 10 pf, so each capacitor is a multiple of "C." Other values could be assigned as desired.

Coarse Tuning

Both the forward and reflected power are measured. If reflected power is greater than a predefined percentage of forward power, then the system self-adjusts to coarse tuning by making the large jumps mentioned above (by increasing capacitance until reflected power drops below the maximum value of reflected power that the fine tuning mode can handle). When that condition is reached, then the system goes into fine tuning. The upper limit of the size of the capacitance jump is determined by the capacitance range of the fine tuning subsystem. When the reflected power drops below a preset upper size limit, then the system will begin fine tuning. This is the "start fine tuning mode" point.

Fine Tuning

After taking a step (either increasing or decreasing capacitance) the reflected power is measured again. If reflected power has increased and the direction (i.e., increase or decrease of capacitance) has been reversed from the previous step, then the system goes back one step to the "start fine tuning mode" point. Fine tuning begins again, only this time in the opposite direction (that is, adding capacitance instead of subtracting it). If, however, the reflected power did not increase, then another step is taken in the same direction (adding or subtracting capacitance). This process continues until another reversal of the direction is encountered. At this stage the system goes back one step and the fine tuning is complete. The reflected power is now at a minimum. The forward power is measured and compared to a pre-defined value, to ensure correct functioning of the RF transmitter.

Auto-tune subsystem 36 performs two major functions. One is to re-tune the RF coil to provide optimum performance under a range of coil loading conditions. Secondly, it determines the state of the tune by comparing it to a pre-defined "zero" setting. The system consists of a radio frequency power source, a directional watt-meter and switched capacitors to vary tuning reactance. Control unit 21 operates the RF power source, measures the reflected power and then varies the tuning reactance until a minimum in reflected power is reached. The system's ability to tune the sample coil directly results in increased overall efficiency. Antenna tuning systems commonly used in radio electronics are unnecessarily complex for coil fine tuning in NQR and NMR applications. They also have certain inefficiencies for NQR and NMR applications: they cannot tune the coil directly, and they experience higher feed line losses, which can contribute to noise. Furthermore, antenna tuning systems tend to be too general in terms of what is being matched (for example, tuning range).

To further describe the detection system of FIG. 1, RF probe 35 is a matching network and Balun which provides tuning and matching of the coil, and also protects preamplifiers 25 from the high voltages in the coil during RF excitation. RF probe 35 matches RF coil 34 to a 50 Ω unbalanced input. This makes the coil look like a 50 Ω transmitter/receiver and is conventional matching technology. The function of ¼ wave line 38 is to isolate the receiver from the transmitter. Transmitter isolation diodes 39 and 40 have a related function. The auto-tune subsystem determines the state of the tune of RF coil 34 in the detector head by matching the RF coil to its load in the detection volume. It measures the amount of power transferred directly to the RF coil (the "forward" power), and the amount of power reflected back due to losses in the circuit and mis-tuning (the "reflected" power). Once the tuning state is determined by comparing the values of the forward and reflected powers, the coil is re-tuned by switching capacitance according to a predetermined sequencing as has been discussed in above.

When coil 34 is loaded with a package of unknown contents, it becomes de-tuned. In one application of this invention, to re-tune the coil, eight vacuum relays switch the capacitors arranged in pF values of powers of two, that is, 10, 20, 40, 80. This particular arrangement is capable of producing 256 values of capacitance for re-tuning the system, with a maximum total of 3000 pF. Rather than overloading the system with one relay for each value of capacitance, this power arrangement minimizes the number of relays needed to produce a given value of capacitance (eg. 10+20=30; 20+80 =100, etc.), and affords very fast operational speed. It should be noted that the same algorithm can be used with a continuously-variable capacitance system. A stepper motor could be employed and the actual tuning sequence would be very similar to that described for discrete, direct capacitor tuning. The direct coil tuning capacitance arrangement described above is preferred for this invention.

Using capacitors switched by vacuum relays requires a "settling time" of about 6 ms or less to allow the relays to operate and for the reflected power to achieve a steady-state value. The benefit in overall system ruggedness, efficiency, reliability, and small size due to the fixed switch capacitor scheme overcome any possible advantage in precision tuning which might have been achieved using the more conventional variable capacitors. However, because the system uses switching commands controlled by a computer operated sequence controlling device, it can get exact information on the amount of system de-tuning.

This tuning apparatus of the detection system offers improved sensitivity for NQR systems by optimum automatic fine tuning of the sample coil (RF coil). Previous developments in coil fine tuning required manual tuning of the system, which is acceptable for the laboratory but undesirable for field use. This system offers the advantage of automatic tuning based on fixed capacitors switched by vacuum relays (designed for high RF switching) rather than bulkier and slower variable capacitors. The proposed system measures changes in coil loading, a feature not available on other detection systems. The system is faster and easier to use than a manually tuned sample coil, and provides information about the state-of-tune of the RF coil which can give an indication of the contents of the coil (the sample). The system also gives the control unit an indication of the performance of the RF amplifier.

Once the auto-tuning procedure has been completed, the scanning procedure begins. The scanning procedure is standard for detecting NQR signals in real-world detection applications. In one application of this invention, the procedure consists of a combination of RF pulses, commonly known as PAPS (phase-alternated pulse sequence) and NPAPS (non-phase-alternated pulse sequence) versions of the SSFP (steady state free precession) pulse sequence. These sequences are described in U.S. Pat. No. 5,365,171, which is incorporated herein by reference to the extent necessary for full explanation. However, there are other sequences of RF pulses which are commonly used in NQR procedures which are also applicable for use in this invention. These are known and readily useable by those of ordinary skill in this technical field.

When the test is commenced, the coil is tuned as described and scanning of the package is accomplished and at least one of the lights is illuminated. White light 91 flashes while tuning and testing are being completed. Illumination of green light 92 indicates that no contraband being tested for is present. Illumination of red light 93 indicates that the target substance has been found in such a quantity as to be significant. If yellow light 94 is illuminated, it means there may be something present which should be looked at or further tested. It could mean there is a significant amount of metal present. Both yellow and green lights illuminated means there was no clear NQR signal and there was metal or other conductive material present. Both red and yellow lights illuminated indicates that the target substance may be present, but it is at least partially obscured by metal. Those are indeterminate results. Not shown is an ON/OFF button on a non-visible side of unit 81.

One challenge which must be overcome in proceeding from the laboratory to a practical NQR detection system for scanning airline baggage is that of acoustic ringing. A standing wave can be set up in a conductor placed in a pulsed RF field. This acoustical wave is picked up by the RF coil. The signal produced is often close to the same magnitude and sufficiently close in characteristics to an NQR signal to possibly cause a false alarm. The acoustical signal is often coherent with the exciting RF pulse, and hence can potentially be mistaken for an NQR signal, which is also coherent with the exciting RF pulse. Moreover, common methods for reducing spurious ringing effects in laboratory NQR systems, such as signal averaging and/or reversing the RF phase, will often not sufficiently reduce the problem. Certain types of commonly-occurring materials, such as spring steel, are particularly prone to acoustic ringing.

In the preferred embodiment of this invention, a simple but effective method of reducing the effects of acoustic ringing in NQR detection applications is employed. The primary differing characteristic of an NQR signal compared with an acoustic ringing signal is that NQR signals occur only at pre-defined frequencies. Acoustic ringing signals, on the other hand, can be generated by any frequency of an RF excitation pulse. Thus, by operating the NQR scanning system at a frequency outside the range of the NQR sample frequency, using a standard or modified RF pulse sequence, no signal will be generated by or be detected from any target material. Under these conditions, if a signal is seen, it is from acoustic ringing. Implementation of this method is straightforward in the tuning system of the invention. The "ring detect" sequence can be implemented before or after the main sample detect sequence and is part of the programming and RF signal generation. This frequency excursion can easily be provided by the auto-tune aspect of this invention.

In the scanner system of FIG. 1, when employing analog detectors, signal capture and data processing subsystem 41 comprises two analog to digital (A/D) converters 42 and 43 and digital signal processor 44. The received signals from phase sensitive detectors 27 and 28 are fed to A/D converters 42 and 43 respectively. All signals produced by the sample scan and ring detect sequences are fed into the A/D converters and are processed by the digital signal processor. Through the sample scan sequence, signals are either added or subtracted, according to the algorithm outlined in U.S. Pat. No. 5,365,171. The addition/subtraction algorithm reduces the effects of RF coil ring-down and magnetoacoustic ringing.

In a practical configuration of this portion of the invention, signal capture and most of the signal processing is carried out on a plug-in PC A/D converter card. The card has two channels, 14-bit resolution, and a 2 MHz sampling rate. Subsystem 41 also performs on-board digital signal processing functions, such as addition or subtraction of consecutive data sets as required. Once processing the output signal is completed, it is digitally filtered and compared to a predefined threshold level. Alternatively, once the signal is apodized and Fourier-transformed, it occurs as a quadrature "spike" at or close to 0 Hz in the frequency spectrum, and is then filtered and compared to the "known" signal of the material to be detected.

In the frequency domain, the signal capture and data processing subsystem compares other signal factors to the expected signal factors. For example, it may compare the signal shape (Lorentzian or Gaussian) to the line-width at half height. A combination of the above signal factors may be used to determine the presence or absence of the target substance. The output of the digital signal processor is then sent to display device 46.

The NQR detected signal is compared with a predetermined threshold level stored in memory in digital signal processor 44. If the detected signal is equal to or greater than the predetermined threshold, red light 93 flashes on the operator's panel on display device 46, indicating the presence of the target substance. If the signal is less than the predetermined threshold, green light 92 flashes, indicating the absence of the target substance. If the auto-tune algorithm detects that an excessive amount of re-tuning of the coil is necessary, compared to an average investigation or predefined threshold, or an acoustic ringing signal is detected, the condition is flagged and yellow warning light 94 illuminates. The yellow warning light indicates that: (1) there is an abnormally high amount of metal in the coil, (2) a high quantity of high dielectric material is detected, or (3) a spurious acoustic signal has been detected. Further alternative testing or visual inspection can be used to resolve inconclusive results of the NQR test.

In addition to the illumination indications mentioned above, the display device can optionally provide graphical display 95 of the signal showing both the in-phase and quadrature signals, as well as other signal and system characteristics. Also optionally, primed output 96, including the time, date, signal amplitude and frequency, as well as coil tuning parameters, and other information such as acoustic signal responses from speaker 97, can be provided.

The factors which have degraded the effectiveness of previous NQR signal detectors are reduced or eliminated by this system. If conductive or high dielectric materials are present in the sample, the auto-tune sub-system will be employed in an attempt to neutralize the effect of the foreign material. Then visual inspection can be accomplished if there is reason to do so. The auto-tune capability can quickly account for changes in temperature which affects tuning capacitance, as well as movement or distortion of the coil which might occur when samples are put into the cavity.

The tuning system of the invention has been described as a specific component of an NQR scanner system. Because NMR detector systems also require variable RF frequencies to be applied and detected, this invention has direct application to those detector systems as well. The automatic tuning function of this invention is equally applicable to NQR and NMR detection systems.

This tuning apparatus offers improved sensitivity for NMR and NQR systems by optimum automatic fine tuning of the sample coil. Both the algorithm used and the apparatus designed to implement the algorithm represent a novel departure from current algorithms and apparatuses in the field of NQR and NMR. Furthermore, no known prior art apparatus is as efficient as the proposed system, nor is any capable of displaying or presenting information on the current status of the tune. The proposed system allows for a wide range of impedance matching and the maintenance of a resonant frequency.

An embodiment of the invention has been described above. It is likely that modifications and improvements will occur to those skilled in this technical field which are within the scope of the appended claims.

What is claimed is:

1. An automatic tuning apparatus to establish maximum power transfer efficiency at least one selected predetermined frequency in nuclear quadrupole and nuclear magnetic resonant (NQR/NMR) detection systems when a specimen is inserted into the detection element of an NQR/NMR detection system in order to enable such detection systems to detect nuclear quadrupole or nuclear magnetic resonant frequencies of predetermined substances if present in the specimen, the predetermined substances having predetermined characteristic nuclear resonant frequencies, wherein nuclear resonant frequency is the frequency of nuclear precession due either to quadrupolar interaction with molecular electric field gradients (NQR) or to an applied static magnetic field (NMR), said apparatus comprising:

a sequence controller having means for providing timing and programming pulses to said apparatus;

a variable frequency RF source to provide pulsed RF exitation at a predetermined frequency generally corresponding to the nuclear resonant frequency of a predetermined substance;

a single turn distributed RF coil sheet shaped and configured to define a cavity of predetermined volume therewithin and to receive the specimen within the cavity defined by said coil, the RF signals from said RF source being transmitted within said cavity and being uniformly applied to the specimen within said RF coil cavity and generating a uniform field within said cavity, said RF coil also functioning as the pickup coil for the NQR/NMR signals from the specimen and providing an output signal;

means for measuring the power transfer efficiency of said RF coil at the predetermined nuclear resonant frequency;

an array of fixed value capacitors connected in said apparatus and selectively switchable into circuit with said RF coil; and a plurality of individually controllable switch means for selectively connecting said capacitors into said RF coil circuit;

said sequence controller controlling the switching of said capacitors into and out of circuit with said RF coil pursuant to power transfer efficiency measurements from said measuring means to establish and maintain maximum power transfer efficiency of said RF coil at the predetermined nuclear resonant frequency.

2. The apparatus recited in claim 1, wherein said means for measuring power transfer efficiency of said RF coil comprises means for measuring the amount of power transferred directly to said RF coil from said RF source (forward power), and measuring the amount of power reflected back into said coil (reflected power).

3. A method for automatically tuning apparatus to establish maximum power transfer efficiency at a predetermined frequency in a coil when a specimen is inserted into a cavity formed by said coil to enable said coil to detect nuclear quadrupole or nuclear magnetic resonant (NQR/NMR) frequencies of predetermined substances if present in the specimen, the predetermined substances having predetermined characteristic nuclear resonant frequencies, wherein nuclear resonant frequency is the frequency of nuclear precession due either to quadrupolar interaction with molecular electric field gradients (NQR) or to an applied static magnetic field (NMR), said method comprising the steps of:

shaping and configuring a single turn RF coil sheet to define the cavity having a predetermined volume therewithin, the cavity being adapted to receive specimens to be tested for the presence of the predetermined substances;

inserting the specimen within the cavity formed by the RF coil;

providing RF pulses at about one said predetermined characteristic nuclear resonant frequency to the RF coil to establish a uniform field within the cavity in said coil which encompasses the specimen to thereby uniformly apply RF signals to the specimen within the RF coil cavity;

measuring the power transfer efficiency of the coil at the predetermined nuclear resonant frequency; and selectively switching a plurality of fixed value capacitors into circuit with the RF coil to establish maximum power transfer efficiency of the coil with the specimen therewithin at the predetermined nuclear resonant frequency.

4. The method recited in claim 3, wherein the step of measuring the power transfer efficiency comprises the steps of:

measuring the amount of power transferred directly to the RF coil (forward power);

measuring the amount of power reflected back to the RF coil (reflected power); and selectively switching the fixed value capacitors into and out of circuit with the RF coil in accordance with a feedback algorithm to establish maximum power transfer efficiency of the RF coil at the predetermined nuclear resonant frequency.

5. The system recited in claim 1, wherein each successive capacitor has a capacitive value which is a power of two greater than the previous one.

6. The system recited in claim 5, wherein said controllable switch means comprise a series of vacuum relays, one for each said capacitor, said vacuum relays being individually controlled by said sequence controller.

7. The method recited in claim 3, wherein controller apparatus provides the feedback algorithm controlling the selective switching of the capacitors into and out of circuit with the RF coil, the switching being accomplished through a plurality of vacuum relays to which signals are applied from the controller apparatus.

* * * * *